(12) United States Patent
Heeres et al.

(10) Patent No.: US 10,763,227 B2
(45) Date of Patent: Sep. 1, 2020

(54) PACKAGED RF POWER AMPLIFIER

(71) Applicant: Ampleon Netherlands B.V., Nijmegen (NL)

(72) Inventors: Rob Mathijs Heeres, Nijmegen (NL); Freerk van Rijs, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 16/217,955

(22) Filed: Dec. 12, 2018

(65) Prior Publication Data
US 2019/0181106 A1 Jun. 13, 2019

(30) Foreign Application Priority Data

Dec. 12, 2017 (NL) ...................................... 2020069

(51) Int. Cl.
*H01L 23/66* (2006.01)
*H03F 3/21* (2006.01)
(Continued)

(52) U.S. Cl.
CPC .............. *H01L 23/66* (2013.01); *H01L 24/05* (2013.01); *H01L 24/48* (2013.01); *H01L 25/16* (2013.01); *H03F 1/565* (2013.01); *H03F 3/193* (2013.01); *H03F 3/195* (2013.01); *H03F 3/21* (2013.01); *H03F 3/213* (2013.01);
(Continued)

(58) Field of Classification Search
CPC .......... H01L 23/66; H01L 24/05; H01L 24/48
See application file for complete search history.

(56) References Cited

U.S. PATENT DOCUMENTS 7,084,708 B2 * 8/2006 Sugiura ............. H01L 23/49838
257/E23.07
9,571,044 B1 * 2/2017 Zhu ......................... H03F 1/565
(Continued)

FOREIGN PATENT DOCUMENTS

| EP | 2357667 A2 | 8/2011 |
| EP | 2388815 A1 | 11/2011 |
| EP | 2357667 A3 | 1/2012 |

OTHER PUBLICATIONS

NL Search Report, NL Patent Application No. 2020069 dated Aug. 29, 2018, 6 pages.

*Primary Examiner* — Errol V Fernandes
(74) *Attorney, Agent, or Firm* — McDonnell Boehnen Hulbert & Berghoff LLP

(57) ABSTRACT

The present disclosure relates to a packaged radiofrequency (RF) power amplifier. The present disclosure further relates to a semiconductor die that is used in such a power amplifier and to an electronic device or system that comprises the semiconductor die and/or power amplifier. According to the disclosure, the semiconductor die comprises a second drain bond assembly arranged spaced apart from the first drain bond assembly and electrically connected thereto, wherein the second drain bond assembly is arranged closer to the input side of the semiconductor die than the first drain bond assembly. The RF power amplifier comprises a first plurality of bondwires which extend between the first drain bond assembly and the output lead, and a second plurality of bondwires which extend from the second drain bond assembly to a first terminal of a grounded capacitor.

20 Claims, 4 Drawing Sheets

(51) Int. Cl.
*H01L 23/00* (2006.01)
*H01L 25/16* (2006.01)
*H03F 1/56* (2006.01)
*H03F 3/193* (2006.01)
*H03F 3/213* (2006.01)
*H03F 3/195* (2006.01)

(52) U.S. Cl.
CPC ............... *H01L 2223/6611* (2013.01); *H01L 2223/6655* (2013.01); *H01L 2224/04042* (2013.01); *H01L 2224/05025* (2013.01); *H01L 2224/48091* (2013.01); *H01L 2224/48195* (2013.01); *H01L 2224/49175* (2013.01); *H01L 2924/00014* (2013.01); *H01L 2924/1033* (2013.01); *H01L 2924/10253* (2013.01); *H01L 2924/1306* (2013.01); *H01L 2924/13091* (2013.01); *H01L 2924/19041* (2013.01); *H01L 2924/19105* (2013.01); *H01L 2924/19107* (2013.01); *H01L 2924/30111* (2013.01); *H03F 2200/222* (2013.01); *H03F 2200/361* (2013.01); *H03F 2200/387* (2013.01); *H03F 2200/451* (2013.01)

(56) References Cited

U.S. PATENT DOCUMENTS

| | | | | |
|---|---|---|---|---|
| 9,929,707 | B1* | 3/2018 | Frei | H03F 1/565 |
| 9,979,361 | B1* | 5/2018 | Mangaonkar | H03F 1/565 |
| 9,991,854 | B1* | 6/2018 | Zhu | H03F 3/195 |
| 10,685,927 | B2* | 6/2020 | De Boet | H01L 28/40 |
| 2007/0024358 | A1* | 2/2007 | Perugupalli | H01L 24/49 330/66 |
| 2007/0024374 | A1* | 2/2007 | Blair | H03F 1/56 330/302 |
| 2008/0278241 | A1* | 11/2008 | Harm | H01L 24/49 330/286 |
| 2015/0156910 | A1* | 6/2015 | Zhu | H03F 1/56 361/728 |
| 2015/0294930 | A1* | 10/2015 | Zhu | H03F 1/565 257/337 |
| 2015/0381121 | A1* | 12/2015 | Jones | H01L 23/047 330/250 |
| 2016/0344353 | A1* | 11/2016 | Watts | H01G 4/005 |
| 2017/0117239 | A1 | 4/2017 | Lembeye et al. | |

* cited by examiner

FIG. 1A - PRIOR ART
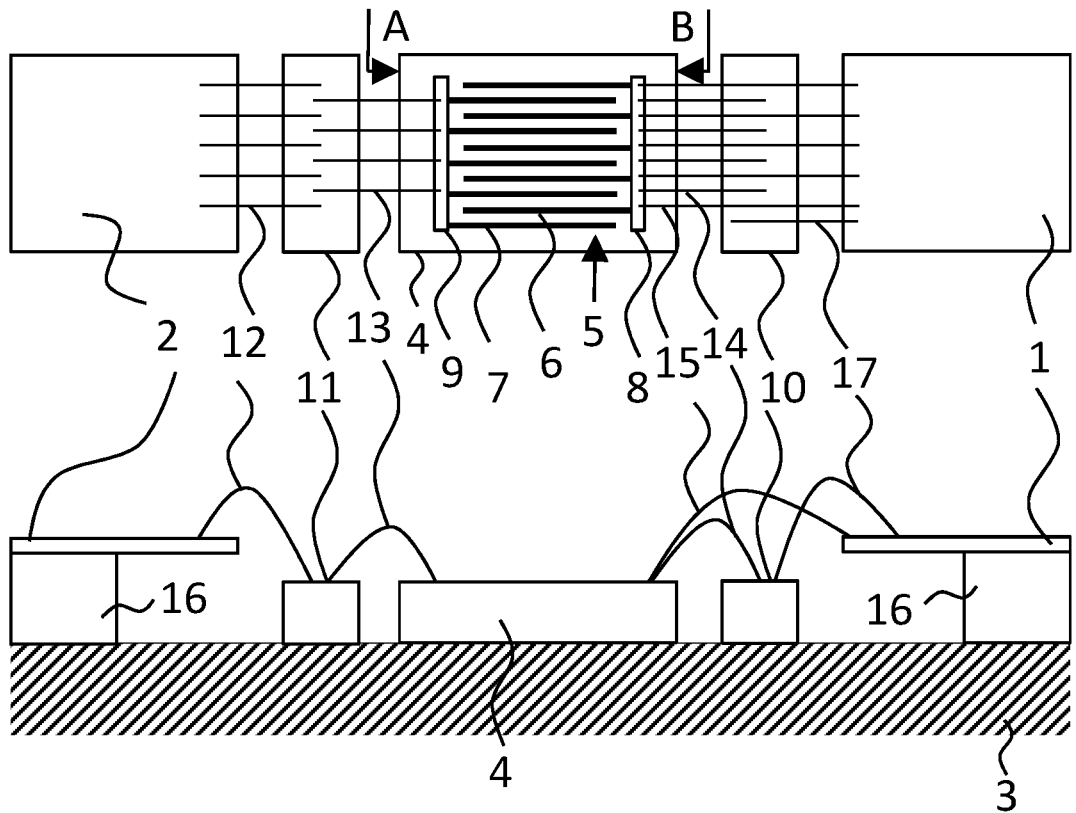
FIG. 1B - PRIOR ART
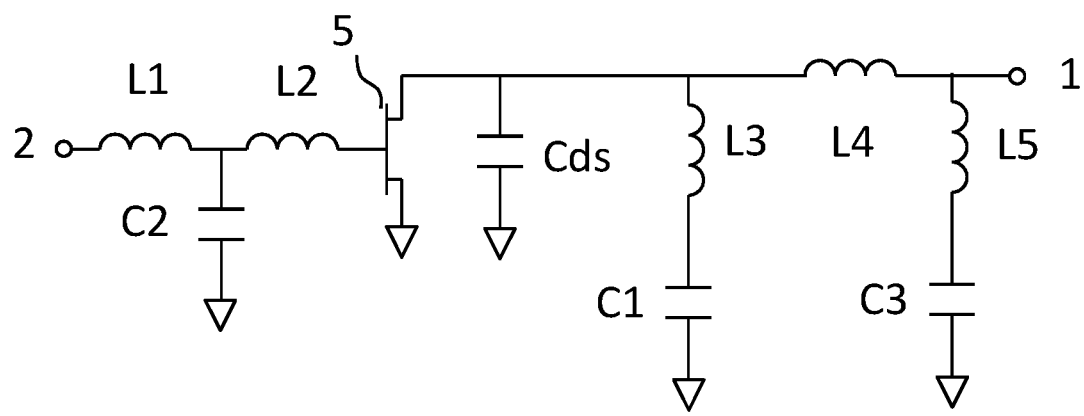
FIG. 1C - PRIOR ART

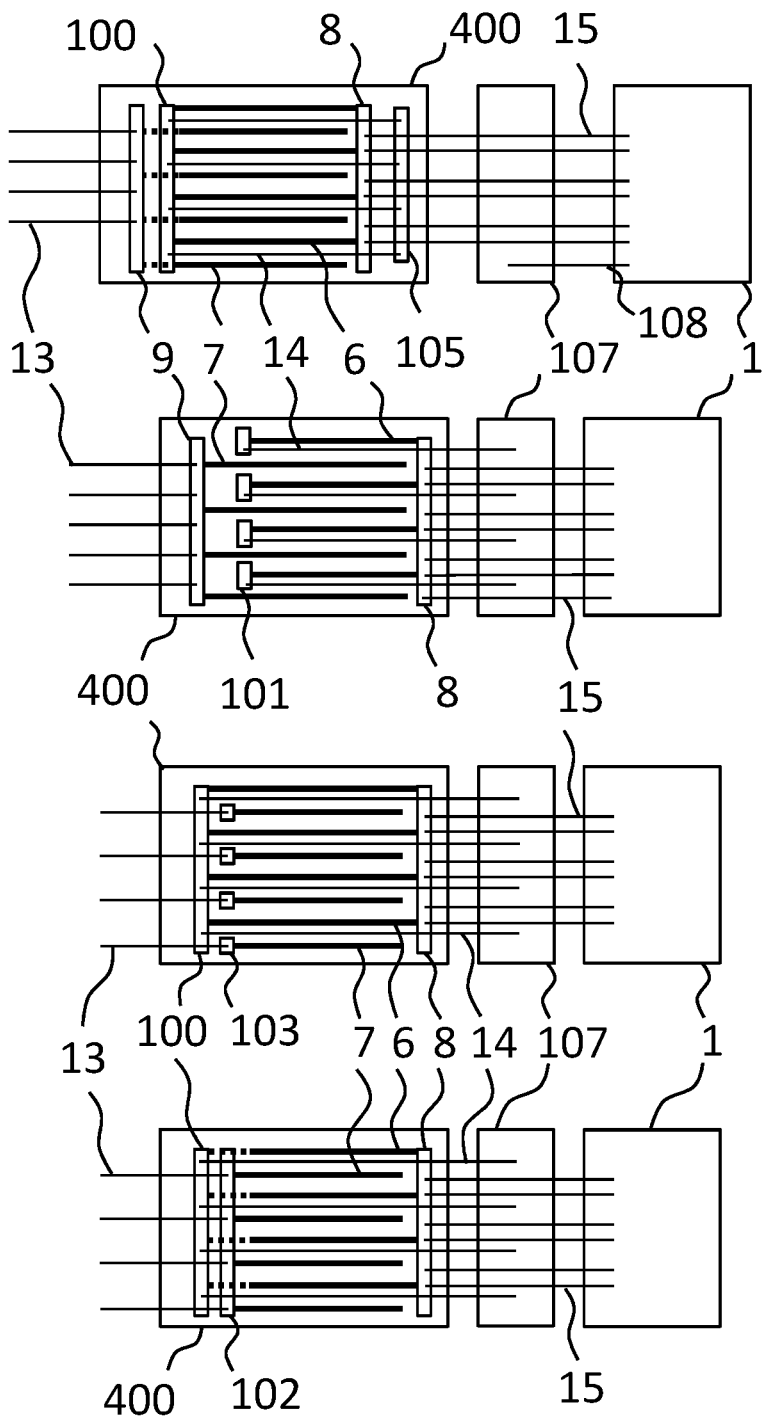

PACKAGED RF POWER AMPLIFIER

CROSS-REFERENCE TO RELATED APPLICATIONS

The present application is a non-provisional patent application claiming priority to Netherlands Patent Application No. 2020069, filed Dec. 12, 2017, the contents of which are hereby incorporated by reference.

FIELD OF THE DISCLOSURE

The present disclosure relates to a packaged radiofrequency (RF) power amplifier. The present disclosure further relates to a semiconductor die that is used in such a power amplifier and to an electronic device or system that comprises the semiconductor die and/or power amplifier.

BACKGROUND

Parasitic capacitance can have a strong influence on gain and efficient of a power amplifier. One method of overcoming this parasitic capacitance may involve placing an inductor in parallel with the capacitor causing gain loss. However, this method may cause undue performance loss in the power amplifier.

SUMMARY

A first example embodiment may be a packaged RF power amplifier that includes a semiconductor die, mounted in a package that has an input lead and an output lead, wherein the semiconductor die comprises a first drain bond assembly configured for the mounting of a first plurality of bondwires extending from the first drain bond assembly to the output lead, and an RF power transistor having a drain that is electrically connected to the first drain bond assembly. The semiconductor die comprises an input side that, when the semiconductor die is mounted in the packaged, is arranged closer to the input lead than to the output lead and an output side that is arranged closer to the output lead than to the input lead. The semiconductor die may comprise a second drain bond assembly arranged spaced apart from the first drain bond assembly and electrically connected thereto, the second drain bond assembly being configured for the mounting of a second plurality of bondwires electrically connecting the second drain bond assembly to a first terminal of a first capacitor of which a second terminal is grounded.

BRIEF DESCRIPTION OF THE FIGURES

The above, as well as additional, features will be better understood through the following illustrative and non-limiting detailed description of example embodiments, with reference to the appended drawings.

FIG. 1A illustrates a top view of a packaged RF power amplifier.

FIG. 1B illustrates a cross sectional side view of a conventional packaged RF power amplifier.

FIG. 1C illustrates an equivalent circuit of the amplifier in FIG. 1A.

FIGS. 2A-2D illustrate various embodiments of a semiconductor die, according to example embodiments.

Figure 3:
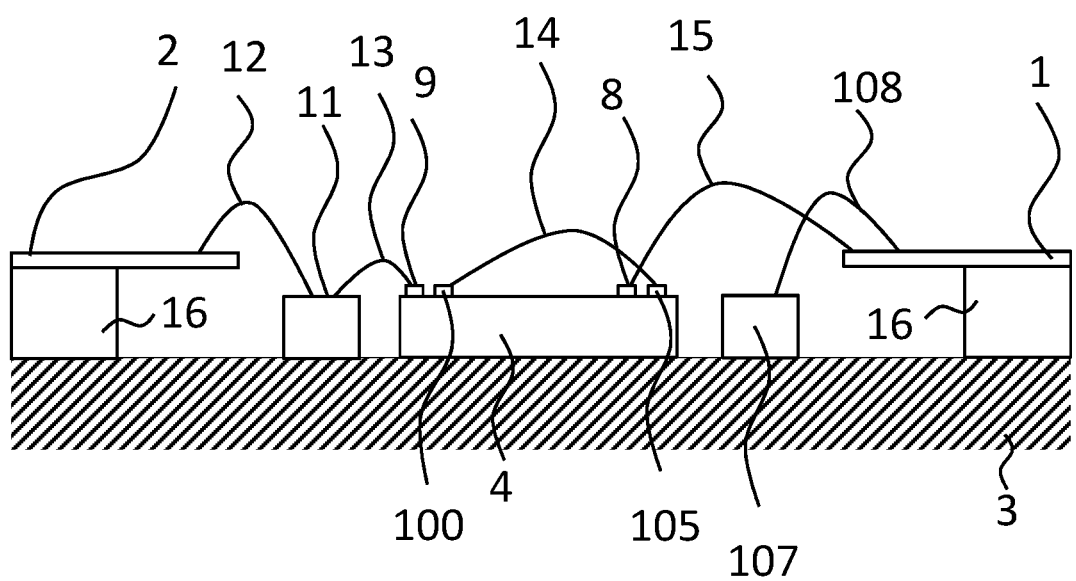
FIG. 3 illustrates a cross sectional side view of the semiconductor die of FIG. 2A mounted in a package to form an RF power amplifier, according to an example embodiment.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

FIGS. 1A and 1B illustrate a schematic top view and cross sectional view of a conventional packaged power amplifier, whereas FIG. 1C illustrates an equivalent circuit thereof.

The conventional amplifier comprises a package having an output lead 1, an input lead 2, and a flange 3. Output lead 1 and input lead 2 are separated from flange 3 using a ceramic ring 16. After assembly of the packaged amplifier on a printed circuit board (PCB), flange 3 is typically connected to the ground of the PCB.

A semiconductor die 4 is arranged on flange 3. On this die, an RF power transistor 5 is arranged. Power transistor 5 comprises drain fingers 6 and gate fingers 7, which are electrically connected to a first drain bond assembly 8 and a gate bond assembly 9, respectively. For example, RF power transistor 5 could comprise a Silicon based laterally diffused metal-oxide-semiconductor (LDMOS) transistor.

Semiconductor die 4 comprises an input side A that is arranged closer to input lead 2 than to output lead 1 and an output side B that is arranged closer to output lead 1 than to input lead 2.

The packaged amplifier further comprises capacitors C1, C2 that may be realized on further semiconductor dies or which may be provided in the form of discrete components. In FIGS. 1A and 1B, capacitors C1 and C2 are formed on semiconductor dies 10, 11, respectively.

A plurality of bondwires 12 extends from input lead 2 to a first terminal of capacitor C2. The other terminal of this capacitor is connected to ground. For example, the substrate material of semiconductor die 11 could be conductive allowing a low ohmic connection from the other terminal of C2, via the substrate, to flange 3 on which semiconductor die 11 is mounted. This plurality of bondwires 12 has a given inductance, which is represented by inductor L1 in the equivalent circuit depicted in FIG. 1C. Another plurality of bondwires 13 extends from the first terminal of C2 to gate bond assembly 9. This plurality of bondwires is represented by inductor L2 in FIG. 1C.

From first drain bond assembly 8, two pluralities of bondwires extend. A first plurality of bondwires 15, represented by inductor L4 in FIG. 1C, extends from drain bond assembly 8 to output lead 1. A second plurality of bondwires 14, represented by inductor L3 in FIG. 1C, extends from first drain bond assembly 8 to a first terminal of capacitor C1. The other terminal of C1 is grounded similar to the grounded terminal of C2.

The power amplifier may optionally comprise a further capacitor C3 that is arranged on semiconductor die 10. A first terminal of this capacitor may be connected to output lead 1 using one or more bondwires 17, whereas the other terminal of C3 is grounded. In FIG. 1C, the bondwires are represented by an inductor L5.

Power transistor 5 comprises parasitic components that influence the behavior of the transistor. One of these components is the drain-source output capacitance, which can be represented by a capacitor Cds arranged between the drain and source terminals of power transistor 5, as illustrated in FIG. 1C. When left unaccounted for, this parasitic capacitance has a strong influence on gain and efficiency of the power amplifier.

One conventional approach to mitigate the influence of Cds on performance is to make use of an inductor that is placed parallel to Cds. Together, these components should display a parallel resonance at or close to the operational frequency of the amplifier. This would ensure that the combined impedance of Cds and the inductor is sufficiently high to no longer significantly degrade the RF behavior of the amplifier. For example, Cds could be at least partially compensated using the inductor causing the amplifier to see an impedance at the operational frequency that has a larger real part than the impedance in case no compensation is used.

In FIG. 1C, the abovementioned inductor, which is placed parallel to Cds, is formed by the second plurality of bondwires 14, i.e. L3. Capacitor C1 should be sufficiently large to act as an RF short at the operational frequency. More in particular, the series connection of L3 and C1 should act as an inductance at the operational frequency to allow the parallel resonance with Cds. At DC, C1 blocks a DC path to ground.

A relatively large coefficient of mutual inductance exists between L3 and L4. In conventional examples, this mutual inductance degrades the performance of the power amplifier. More in particular, the mutual inductance makes the compensation of the output capacitance Cds by L3 less effective, resulting in a smaller impedance transformation and therefore a lower output impedance than without this mutual coupling, but with losses. This in turn can also lower the efficiency as a larger impedance transformation is required in the next matching step, with its own additional losses.

The power amplifier described in examples embodiments herein may remedy this performance problem, because such embodiments characterize the semiconductor die as comprising a second drain bond assembly arranged spaced apart from the first drain bond assembly and electrically connected thereto, wherein the second drain bond assembly is arranged closer to the input side of the semiconductor die than the first drain bond assembly, and wherein the second plurality of bondwires extends from the second drain bond assembly to the first terminal of the first capacitor.

The bond assembly from which the second plurality of bondwires extends is different from the bond assembly from which the first plurality of bondwires extends. Furthermore, because the second bond assembly is shifted more towards the input side of the semiconductor die, there will be less overlap between the current loops associated with the first and second plurality of bondwires. This will result in a lower coefficient of mutual inductance between L3 and L4 in FIG. 1C. Consequently, the efficiency and output impedance of the power amplifier will improve.

As stated above, the RF power transistor may have a drain-source output capacitance. An inductance of the second plurality of bondwires and a capacitance of the first capacitor may be arranged such that, at or close to an operational frequency of the RF power amplifier, the series connection of the first capacitor and the second plurality of bondwires resonates with the drain-source output capacitance.

The RF power transistor may comprise a plurality of drain fingers that extend between the first and second drain bond assemblies. Typically, the drain fingers are aligned with a direction between the input and output sides of the semiconductor die.

The packaged RF power amplifier may further comprise a gate bond assembly that is electrically connected to the input lead, and wherein the RF power transistor comprises a gate that is electrically connected to the gate bond assembly and a plurality of gate fingers that extend from the gate bond assembly and which are arranged in an interdigitated manner with the drain fingers. In an embodiment, the gate bond assembly may be arranged closer to the input side than the second drain bond assembly. Hence, in this embodiment, the second drain bond assembly is arranged in between the gate bond assembly and the first drain bond assembly. In this case, the second drain bond assembly may comprise a first bond-bar and the gate fingers may extend underneath the first bond-bar. Alternatively, the second drain bond assembly may comprise a plurality of spaced apart first bondpads and the gate fingers may extend in between the first bondpads. To realize the arrangements above, the semiconductor die may comprise a metal layer stack comprising lower metal layers and higher metal layers, wherein the lower metal layers are arranged closer to the surface of a substrate of the semiconductor die than the higher metal layers, wherein the first and second drain bond assemblies and the gate bond assembly are formed in the higher metal layers, and wherein the drain and gate fingers are formed in at least the lower metal layers. For example, the semiconductor die may comprise a plurality of vias that electrically connect the second drain bond assembly formed in the higher metal layer(s) to the drain fingers, and wherein the gate fingers extend in between the vias.

Alternatively, the second drain bond assembly is arranged closer to the input side than the gate bond assembly. Hence, in this embodiment, the gate bond assembly is arranged in between the first and second bond assemblies. In this case, the gate bond assembly may comprise a second bond-bar and the drain fingers may extend underneath the second bond-bar. Alternatively, the gate bond assembly may comprise a plurality of spaced apart second bondpads and the drain fingers may extend in between the second bondpads. To realize the arrangements above, the semiconductor die may comprise a metal layer stack comprising lower metal layers and higher metal layers, wherein the lower metal layers are arranged closer to the surface of a substrate of the semiconductor die than the higher metal layers, wherein the first and second drain bond assemblies and the gate bond assembly are formed in the higher metal layers, and wherein the drain and gate fingers are formed in the lower metal layers. For example, the semiconductor die may comprise a plurality of vias that electrically connect the gate bond assembly formed in the higher metal layer(s) to the gate fingers, and wherein the drain fingers extend in between the vias.

The first capacitor may be formed on the semiconductor die. Alternatively, the first capacitor may be arranged in between the semiconductor die and the output lead. For example, the power amplifier may comprise a further semiconductor die arranged in the package in between the semiconductor die and the output lead, wherein the first capacitor is arranged on the further semiconductor die. This further semiconductor may comprise a further capacitor having a first terminal and a grounded second terminal. The packaged RF power amplifier may further comprise one or more third bondwires extending from the output lead to the first terminal of the further capacitor. The latter bondwires may form, together with the further capacitor, an output matching network.

The operational frequency of the RF power amplifier, for example corresponding to the carrier frequency of a signal to be amplified, may lie within a range from 500 MHz to 40 GHz. Moreover, a capacitance of the first capacitor may be larger than 5 pF, and wherein an inductance of the second plurality of bondwires may lie within a range from 0.05 nH to 5 nH.

The semiconductor die may comprise a Silicon based laterally diffused metal-oxide-semiconductor (LDMOS) transistor or a Gallium Nitride based field-effect transistor (FET).

According to a further aspect, the disclosure relates to a semiconductor die, mountable in a package that has an input lead and an output lead, wherein the semiconductor die comprises a first drain bond assembly configured for the mounting of a first plurality of bondwires extending from the first drain bond assembly to the output lead, and an RF power transistor having a drain that is electrically connected to the first drain bond assembly. The semiconductor die comprises an input side that, when the semiconductor die is mounted in the packaged, is arranged closer to the input lead than to the output lead and an output side that is arranged closer to the output lead than to the input lead. According to the second aspect, the semiconductor die is characterized in that the semiconductor die comprises a second drain bond assembly arranged spaced apart from the first drain bond assembly and electrically connected thereto, the second drain bond assembly being configured for the mounting of a second plurality of bondwires electrically connecting the second drain bond assembly to a first terminal of a first capacitor of which a second terminal is grounded.

The semiconductor die may further be configured as the above described semiconductor die of the RF power amplifier.

According to a third aspect, the present disclosure relates to an electrical device or system, such as a base station for mobile telecommunications, that comprises the semiconductor die and/or RF power amplifier as described above.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

FIGS. 2A-2D illustrate various embodiments of a semiconductor die 400, according to example embodiments. FIG. 2A illustrates an embodiment wherein the second drain bond assembly is formed as a bond-bar 100 and is arranged in between first drain bond assembly 8 and gate bond assembly 9. Furthermore, the first drain bond assembly 8 and the gate bond assembly 9 are formed as a bond-bar.

In the embodiment of FIG. 2A, gate fingers 7 extend below bond-bar 100. Further, first capacitor C1 is an integrated capacitor 105 located near the output side of semiconductor die 400. More in particular, integrated capacitor 105, formed as a metal-insulator-metal capacitor (MIMCAP) or metal-oxide-semiconductor capacitor (MOSCAP) is arranged in between first drain bond assembly 8 and an edge 106 of semiconductor die 400 that corresponds to output side B. In some embodiments, a further capacitor C3 may be arranged on a semiconductor die 107 in between semiconductor die 400 and output lead 1. Together with bondwires 108 that extend between output lead 1 and a first terminal of further capacitor C3, an output matching network may be formed. In this case, the second terminal of further capacitor C3 is grounded. It should be noted that, in some embodiments, further capacitor C3 is not present or is integrated on semiconductor die 400.

FIG. 2B illustrates an embodiment wherein the second drain bond assembly is arranged in between first drain bond assembly 8 and gate bond assembly 9. Furthermore, the second drain bond assembly is formed as a plurality of spaced apart bondpads 101. In this embodiment, gate fingers 7 extend in between bondpads 101.

FIG. 2C illustrates an embodiment wherein gate bond assembly is arranged as a plurality of spaced apart bondpads 103 in between first drain bond assembly 8 and second drain bond assembly 100. In this embodiment, drain fingers 6 extend in between bondpads 103. Similar to FIG. 2C, gate fingers 7 may extend to either side of bond-bar 103, or just to one side thereof.

FIG. 2D illustrates an embodiment wherein the gate bond assembly is arranged as a bond-bar 102 in between first drain bond assembly 8 and second bond assembly 100. In this embodiment, drain fingers 6 extend below bond-bar 102. Moreover, gate fingers 7 may extend to either side of bond-bar 102, or just to one side thereof.

FIG. 3 illustrates a cross sectional side view of the semiconductor die of FIG. 2A mounted in a package to form an RF power amplifier, according to example embodiments. The equivalent circuit of FIG. 1C equally applies to this embodiment. However, when comparing this embodiment to the cross sectional view of FIG. 1B, it becomes clear that L3 and L4 will display a much lower coefficient of mutual inductance due to less electromagnetic coupling between the loops associated with bondwires 14 and 15. Again, the matching arrangement of further capacitor 107 and bondwires 108 is optional.

Figure 4A:
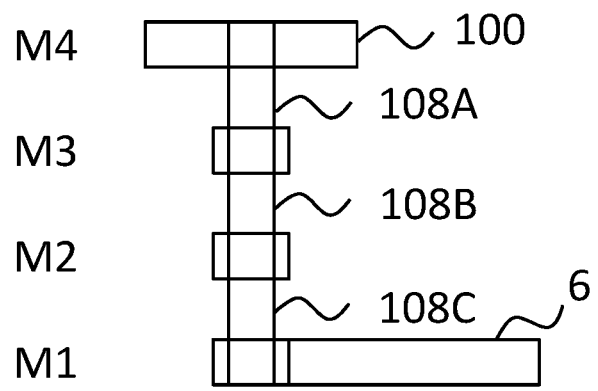
FIGS. 4A and 4B illustrate the example embodiment of FIG. 2A in further detail.
Figure 4B:
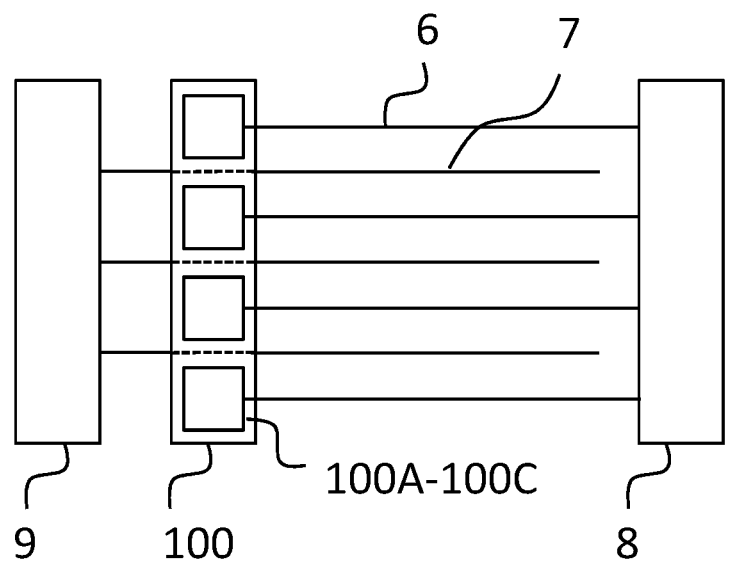

FIGS. 4A and 4B illustrate the embodiment in FIG. 2A in more detail. More in particular, FIG. 4A illustrates a metal layer stack comprising a plurality of metal layers (M1-M4). The metal layers can be used to define patterns for signal propagation. In this example, bond-bar 100 is formed in metal M4, whereas drain fingers 6 and gate fingers 7 are formed in metal layer M1. These fingers can be extended to higher metal layers if this would not interfere with other structures. Vias 108A-108C are realized to connect structures in different metal layers to each other. For example, vias 108A-108C are used to connect bond-bar 100 to drain fingers 6.

FIG. 4B illustrates how gate fingers 7 pass underneath bond-bar 100 without making electrical contact. If the second drain bond assembly was arranged as a plurality of spaced apart bondpads 101 as illustrated in FIG. 2B, it would have been possible to even arrange gate fingers 7 on the same metal layer(s) as bondpads 101. This may be advantageous as it could result in a lower gate-drain capacitance and/or lower gate resistance.

The skilled person will readily understand that embodiments are not limited to four metal layers and that more or less layers may be used.

In the above, example embodiments have been described. It should be apparent to the skilled person that various modifications may be possible without deviating from the scope of the disclosure, which is defined by the appended claims.

What is claimed is:

1. A packaged RF power amplifier, comprising:
    a package comprising an output lead and an input lead;
    a semiconductor die mounted in the package and comprising:
        a first drain bond assembly; and
        an RF power transistor having a drain that is electrically connected to the first drain bond assembly;
    a first plurality of bondwires extending from the first drain bond assembly to the output lead;
    a first capacitor arranged in the package and having a first terminal and a second grounded terminal; and
    a second plurality of bondwires electrically connecting the drain to the first terminal of the first capacitor,
    wherein the semiconductor die comprises an input side that is arranged closer to the input lead than to the output lead and an output side that is arranged closer to the output lead than to the input lead,
    wherein the semiconductor die comprises a second drain bond assembly arranged spaced apart from the first drain bond assembly and electrically connected thereto,
    wherein the second drain bond assembly is arranged closer to the input side of the semiconductor die than the first drain bond assembly, and
    wherein the second plurality of bondwires extends from the second drain bond assembly to the first terminal of the first capacitor.

2. The packaged RF power amplifier according to claim 1, wherein the RF power transistor has a drain-source output capacitance, and
    wherein an inductance of the second plurality of bondwires and a capacitance of the first capacitor are arranged such that at an operational frequency of the RF power amplifier, a series connection of the first capacitor, and the second plurality of bondwires resonates with the output capacitance.

3. The packaged RF power amplifier according to claim 1, wherein the RF power transistors comprise a plurality of drain fingers that extend between the first and second drain bond assemblies.

4. The packaged RF power amplifier according to claim 3, further comprising a gate bond assembly that is electrically connected to the input lead, wherein the RF power transistor comprises a gate that is electrically connected to the gate bond assembly and a plurality of gate fingers that extend from the gate bond assembly and are arranged in an interdigitated manner with the drain fingers.

5. The packaged RF power amplifier according to claim 4, wherein the gate bond assembly is arranged closer to the input side than the second drain bond assembly.

6. The packaged RF power amplifier according to claim 5, wherein the second drain bond assembly comprises a first bond-bar, and
    wherein the gate fingers extend underneath the first bond-bar.

7. The packaged RF power amplifier according to claim 5, wherein the second drain bond assembly comprises a plurality of spaced apart first bondpads, and
    wherein the gate fingers extend in between the first bondpads.

8. The packaged RF power amplifier according to claim 5, wherein the semiconductor die comprises a metal layer stack comprising lower metal layers and higher metal layers,
    wherein the lower metal layers are arranged closer to a surface of a substrate of the semiconductor die than the higher metal layers,
    wherein the first and second drain bond assemblies and the gate bond assembly are formed in the higher metal layers, and
    wherein the drain and gate fingers are formed in at least the lower metal layers.

9. The packaged RF power amplifier according to claim 8, wherein the semiconductor die comprises a plurality of vias that electrically connect the second drain bond assembly formed in the higher metal layers to the drain fingers, and
    wherein the gate fingers extend in between the vias.

10. The packaged RF power amplifier according to claim 4, wherein the second drain bond assembly is arranged closer to the input side than the gate bond assembly.

11. The packaged RF power amplifier according to claim 10,
    wherein the gate bond assembly comprises a second bond-bar, and
    wherein the drain fingers extend underneath the second bond-bar.

12. The packaged RF power amplifier according to claim 10,
    wherein the gate bond assembly comprises a plurality of spaced apart second bondpads, and
    wherein the gate fingers extend in between the second bondpads.

13. The packaged RF power amplifier according to claim 10,
    wherein the semiconductor die comprises a metal layer stack comprising lower metal layers and higher metal layers,
    wherein the lower metal layers are arranged closer to a surface of a substrate of the semiconductor die than the higher metal layers,
    wherein the first and second drain bond assemblies and the gate bond assembly are formed in the higher metal layers, and
    wherein the drain and gate fingers are formed in the lower metal layers.

14. The packaged RF power amplifier according to claim 13,
    wherein the semiconductor die comprises a plurality of vias that electrically connect the gate bond assembly formed in the higher metal layers to the gate fingers, and
    wherein the drain fingers extend in between the vias.

15. The packaged RF power amplifier according claim 1, wherein the first capacitor is formed on the semiconductor die.

16. The packaged RF power amplifier according to claim 1, wherein the first capacitor is arranged in between the semiconductor die and the output lead.

17. The packaged RF power amplifier according to claim 16, further comprising a further semiconductor die arranged in the package in between the semiconductor die and the output lead, wherein the first capacitor is arranged on the further semiconductor die.

18. The packaged RF power amplifier according to claim 1, further comprising a further semiconductor die arranged in the package in between the semiconductor die and the output lead, wherein the further semiconductor die comprises a further capacitor having a first terminal and a grounded second terminal, and wherein the packaged RF power amplifier further comprises one or more third bondwires extending from the output lead to the first terminal of the further capacitor.

19. The packaged RF power amplifier according to claim 1, wherein the semiconductor die comprises a Silicon based laterally diffused metal-oxide-semiconductor (LDMOS) transistor or a Gallium Nitride based field-effect transistor (FET).

20. A semiconductor die, mountable in a package that has an input lead and an output lead, the semiconductor die comprising:

a first drain bond assembly configured for mounting of a first plurality of bondwires (extending from the first drain bond assembly to the output lead; and an RF power transistor having a drain that is electrically connected to the first drain bond assembly, wherein the semiconductor die comprises an input side that, when the semiconductor die is mounted in the packaged, is arranged closer to the input lead than to the output lead and an output side that is arranged closer to the output lead than to the input lead, and wherein the semiconductor die comprises a second drain bond assembly arranged spaced apart from the first drain bond assembly and electrically connected thereto, the second drain bond assembly being configured for mounting of a second plurality of bondwires electrically connecting the second drain bond assembly to a first terminal of a first capacitor of which a second terminal is grounded.

* * * * *